(12) United States Patent
Sim et al.

(10) Patent No.: US 12,222,366 B2
(45) Date of Patent: Feb. 11, 2025

(54) CURRENT SENSOR ASSEMBLY AND INVERTER ASSEMBLY HAVING A PLURALITY OF SENSORS

(71) Applicant: LG MAGNA E-POWERTRAIN CO., LTD., Incheon (KR)

(72) Inventors: Somi Sim, Seoul (KR); Sungjin Kim, Seoul (KR); Kyusung Park, Seoul (KR)

(73) Assignee: LG MAGNA E-POWERTRAIN CO., LTD., Incheon (KR)

( * ) Notice: Subject to any disclaimer, the term of this patent is extended or adjusted under 35 U.S.C. 154(b) by 156 days.

(21) Appl. No.: 17/919,644

(22) PCT Filed: Apr. 27, 2020

(86) PCT No.: PCT/KR2020/005500
§ 371 (c)(1),
(2) Date: Oct. 18, 2022

(87) PCT Pub. No.: WO2021/221182
PCT Pub. Date: Nov. 4, 2021

(65) Prior Publication Data
US 2023/0142008 A1    May 11, 2023

(51) Int. Cl.
*G01R 1/04* (2006.01)
*G01R 1/18* (2006.01)
*G01R 31/34* (2020.01)

(52) U.S. Cl.
CPC ................. *G01R 1/04* (2013.01); *G01R 1/18* (2013.01); *G01R 31/343* (2013.01)

(58) Field of Classification Search
CPC .......... G01R 1/04; G01R 1/18; G01R 15/207; G01R 19/0092; G01R 31/343;
(Continued)

(56) References Cited

U.S. PATENT DOCUMENTS

2013/0320968 A1   12/2013   Sakamoto et al.
2017/0131329 A1*   5/2017   Gorai ................... G01R 15/202
(Continued)

FOREIGN PATENT DOCUMENTS

JP   2013-250160 A   12/2013
JP   2016-65791 A    4/2016
(Continued)

*Primary Examiner* — Jay Patidar
(74) *Attorney, Agent, or Firm* — Birch, Stewart, Kolasch & Birch, LLP

(57) ABSTRACT

A current sensor assembly includes a housing; a plurality of shields which are accommodated inside the housing and open toward the top of the housing; a plurality of bus bars to which three-phase current is applied and which are arranged spaced apart from each other so as to go past the plurality of shields, respectively; and a current sensor unit which includes a printed circuit board and a plurality of current sensors disposed on the printed circuit board to measure the current applied to the bus bars. The shields, the bus bars, and the current sensor unit are configured to be accommodated inside the housing, and the current sensors are spaced apart from the bus bars and disposed in the inner spaces of the shields.

14 Claims, 19 Drawing Sheets

(58) Field of Classification Search
CPC .... H02P 27/04; H05K 1/0216; H05K 1/0263; H05K 2201/10272
See application file for complete search history.

(56) References Cited

U.S. PATENT DOCUMENTS

| | | |
|---|---|---|
| 2018/0331525 A1 | 11/2018 | Fukuhara et al. |
| 2019/0212371 A1 | 7/2019 | Racz et al. |
| 2021/0143745 A1* | 5/2021 | Sakamoto ........... H02M 3/1586 |

FOREIGN PATENT DOCUMENTS

| | | | |
|---|---|---|---|
| KR | 20100029390 A * | 3/2010 | |
| KR | 10-1497836 B1 | 3/2015 | |
| KR | 10-2015-0100198 A | 9/2015 | |
| WO | WO 2019/181171 A1 | 9/2019 | |

* cited by examiner (a)

(b)

(c)

(a)

(b)

(c)

(a)

(b)

(c)

CURRENT SENSOR ASSEMBLY AND INVERTER ASSEMBLY HAVING A PLURALITY OF SENSORS

CROSS-REFERENCE TO RELATED APPLICATIONS

This application is the National Stage filing under 35 U.S.C. 371 of International Application No. PCT/KR2020/005500, filed on Apr. 27, 2020, the contents of which are all hereby incorporated by reference herein in their entirety.

TECHNICAL FIELD

The present disclosure relates to a current sensor assembly included in an inverter.

BACKGROUND ART

Recently, there is a rapid advance in development of technology of electric vehicles driving using electricity that is green energy. Electric vehicles refer to vehicles operated using electricity, and may be largely classified into a battery powered electric vehicle and a hybrid electric vehicle.

Here, the battery powered electric vehicle travels only using electricity, and is generally referred to as an electric vehicle. The hybrid electric vehicle refers to a vehicle that travels using electricity and fossil fuels.

Most electric vehicles include a motor configured to generate rotational power, a battery configured to supply power to the motor, an inverter configured to control a number of rotations of the motor, a battery charger configured to charge electricity to the battery, and a low-voltage direct current (DC)/DC converter (LDC) for a vehicle.

Among the elements described above, the inverter includes a sensor configured to sense current to precisely control the motor.

A sensor in the related art configured to sense current is provided separately from a bus bar. In detail, a bus bar, a current sensor, and a shield are combined with each other to thereby provide at least two configurations. Accordingly, an error may occur when the current sensor measures current flowing through the bus bar.

In addition, as the bus bar, the current sensor, and the shield are combined with each other to thereby provide the at least two configurations, it may be difficult to structurally change a location relationship therebetween.

DISCLOSURE OF INVENTION

Technical Problem

Therefore, to obviate those problems, an aspect of the detailed description is to provide a current sensor assembly in which a bus bar, a current sensor, and a shield may be combined with each other as one configuration.

Another aspect of the detailed description is to provide a current sensor assembly in which relative positions and distances between the bus bar, the current sensor, and the shield may be optimized.

Solution to Problem

To achieve these and other advantages and in accordance with the purpose of the present disclosure, as embodied and broadly described herein, there is provided a current sensor assembly including: a housing; a plurality of shields which are accommodated inside the housing and open toward a top of the housing; a plurality of bus bars to which current with three phases is applied and which are arranged spaced apart from each other to go past the plurality of shields, respectively; and a current sensor unit comprising a printed circuit board and a plurality of current sensors disposed on the printed circuit board to measure the current applied to the plurality of bus bars, wherein the plurality of shields, the plurality of bus bars, and the current sensor unit are configured to be accommodated inside the housing, and the current sensors are spaced apart from the plurality of bus bars and disposed in inner spaces of the plurality of shields.

The current sensor assembly may further include a housing cover arranged at an upper end of the housing to cover the inside of the housing, wherein the housing cover extends in a downward direction to include a support protrusion portion in contact with the printed circuit board.

The plurality of current sensors may be disposed on the printed circuit substrate to be spaced apart from each other, and grooves through which the plurality of shields may pass are provided in the printed circuit board.

The plurality of shields may include: inner side surfaces (base) arranged at an inner side of the housing; and protruding surfaces (protruding sides) protruding from opposite sides of the inner side surfaces, wherein the plurality of bus bars are disposed near the inner side surfaces and pass through the plurality of shields, the plurality of current sensors are spaced apart from the plurality of bus bars and arranged between the protruding surfaces, and the inside of the housing is spaced apart from the plurality of shields to provide a first axis in a direction in which the plurality of bus bars pass over the inner side surfaces of the plurality of shields, a second axis in a direction in which the inner side surfaces of the plurality of shields extend, and a third axis in which the plurality of protruding surfaces extend from both ends of the plurality of shields.

Volumes of the plurality of shields may be estimated according to widths and thicknesses of the plurality of shields and lengths of the protruding surfaces, and included in a range in which linearity in a numerical range, in which the plurality of current sensors measure the current applied to the plurality of bus bars, is ensured within a range of current passing through the plurality of bus bars.

The plurality of shields and the plurality of bus bars may be spaced apart from each other in a direction of the third axis by a first distance to ensure the linearity in the numerical range in which the plurality of bus bars measure the current applied to the plurality of bus bars, within the range of the current passing through the plurality of bus bars.

The plurality of current sensors may be spaced apart from the plurality of bus bars in a direction of the third axis by a second distance to maintain the linearity in the measured current within the range of the current passing through the plurality of bus bars.

The plurality of current sensors may be arranged in correspondence to the plurality of the bus bars providing the three phases, respectively, and arranged adjacent to centers between the protruding surfaces of the plurality of shields surrounding of the plurality of current sensors, respectively.

The plurality of current sensors may be arranged spaced apart from surfaces of the inner side surfaces of the plurality of shields in a direction of the third axis by a third distance.

The plurality of current sensors may be disposed spaced apart from centers of the plurality of bus bars in a direction of the second axis by a fourth distance.

The plurality of current sensors may be disposed spaced apart from surfaces of the plurality of bus bars in a direction of the third axis by a constant distance.

Advantageous Effects of Invention

In accordance with the detailed description, effects of the present disclosure described herein may be obtained.

Since a support protrusion portion of a housing cover is in contact with a printed circuit board, vibration of a current sensor in a current sensor unit, which may be caused by vibration of a current sensor assembly when an inverter vibrates according to driving of the inverter, may be reduced. Thus, an error that may be caused by the vibration of the current sensor during detection of current supplied to a bus bar may be reduced.

An optimum volume of the shield such that the current sensor may linearly measure current flowing through the bus bar may be easily determined. Further, a range in which the current sensor may linearly measure current according to a position relationship between the bus bar and a current sensor center portion may be easily determined, and thus, positions of the bus bar and the current sensor may be optimized.

Current flowing through the bus bar may be accurately detected by easily determining a position of the current sensor for minimizing a crosstalk effect generated by an adjacent bus bar and adjusting positions of the current sensor and the shield, by measuring and taking into account respective crosstalk effects of the current sensor positioned inside protruding surfaces of the shield with respect to first to third axes.

The current sensor may be arranged near the bus bar by taking into account a change in a magnetic flux density according to a skin effect of the bus bar, and as the current sensor is arranged near an end portion of the bus bar, a phase delay effect that may be caused by a magnetic flux density difference may be reduced.

A mold unit is not arranged to excessively surround the protruding surfaces, and a large portion of the protruding surfaces is exposed from the mold unit. Accordingly, an inner width w between the protruding surfaces is maintained, and thus, a volume of the shield and a shielding ability of the shield may be maintained to be constant.

MODE FOR THE INVENTION

Description will now be given in detail according to exemplary embodiments disclosed herein, with reference to the accompanying drawings. For the sake of brief description with reference to the drawings, the same or equivalent components may be provided with the same or similar reference numbers, and description thereof will not be repeated. In general, a suffix such as "module" and "unit" may be used to refer to elements or components. Use of such a suffix herein is merely intended to facilitate description of the specification, and the suffix itself is not intended to give any special meaning or function. In describing the present disclosure, if a detailed explanation for a related known function or construction is considered to unnecessarily divert the gist of the present disclosure, such explanation has been omitted but would be understood by those skilled in the art. The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings.

It will be understood that although the terms first, second, etc. may be used herein to describe various elements, these elements should not be limited by these terms. These terms are generally only used to distinguish one element from another.

It will be understood that when an element is referred to as being "connected with" another element, the element can be connected with the another element or intervening elements may also be present. In contrast, when an element is referred to as being "directly connected with" another element, there are no intervening elements present.

A singular representation may include a plural representation unless it represents a definitely different meaning from the context.

Terms such as "include" or "has" are used herein and should be understood that they are intended to indicate an existence of several components, functions or steps, disclosed in the specification, and it is also understood that greater or fewer components, functions, or steps may likewise be utilized.

Figure 1:
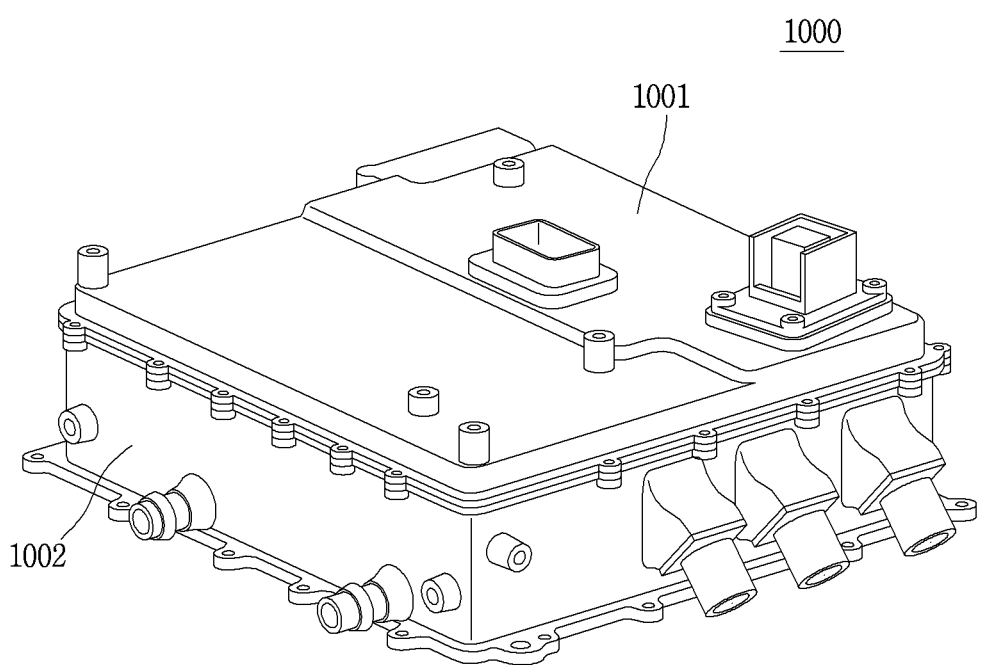
FIG. 1 is a diagram illustrating an integrated power equipment according to an embodiment of the present disclosure.
Figure 2:
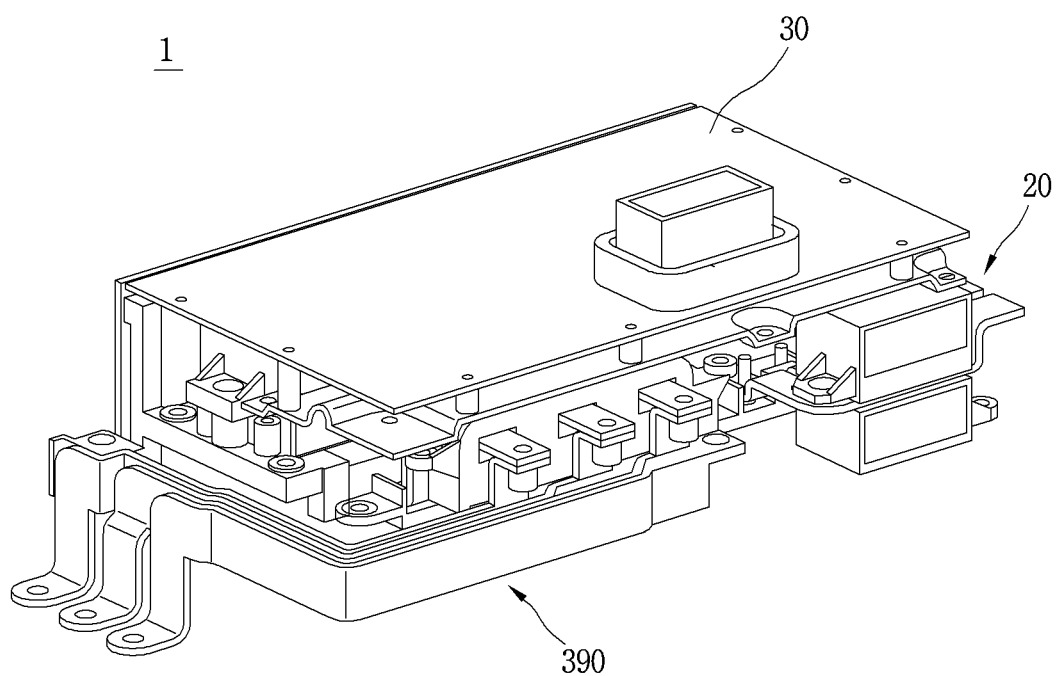
FIG. 2 is a diagram illustrating an inverter assembly according to an embodiment of the present disclosure.
Figure 3:
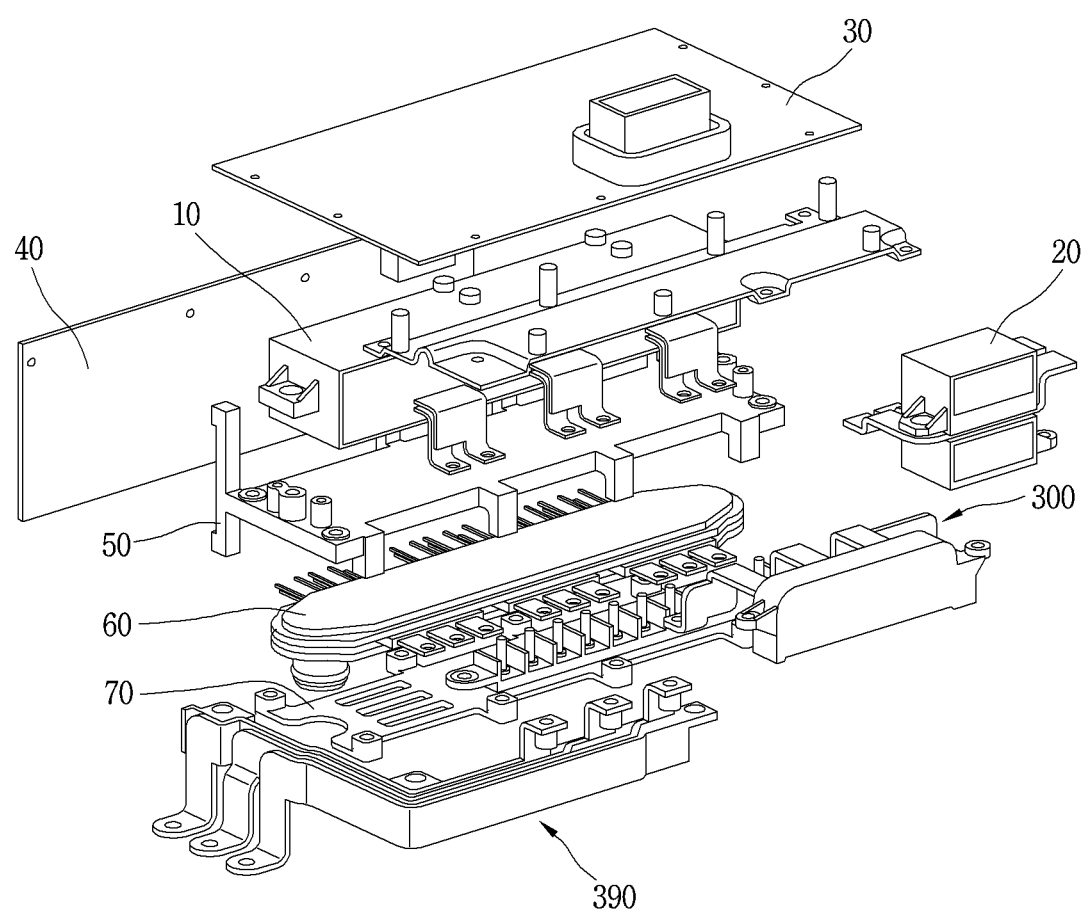
FIG. 3 is an exploded perspective view illustrating the inverter assembly of FIG. 2.
Figure 4:
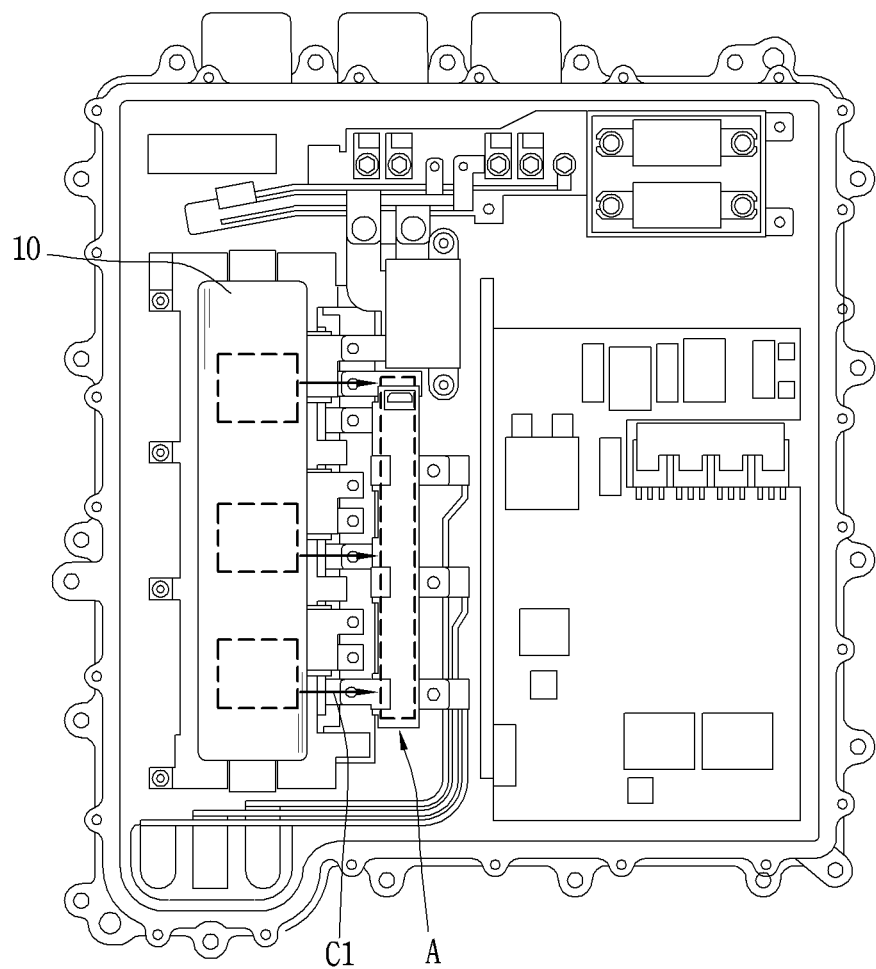
FIGS. 4 and 5 are diagrams for explaining a direction in which current flows in the inverter assembly.
Figure 5:
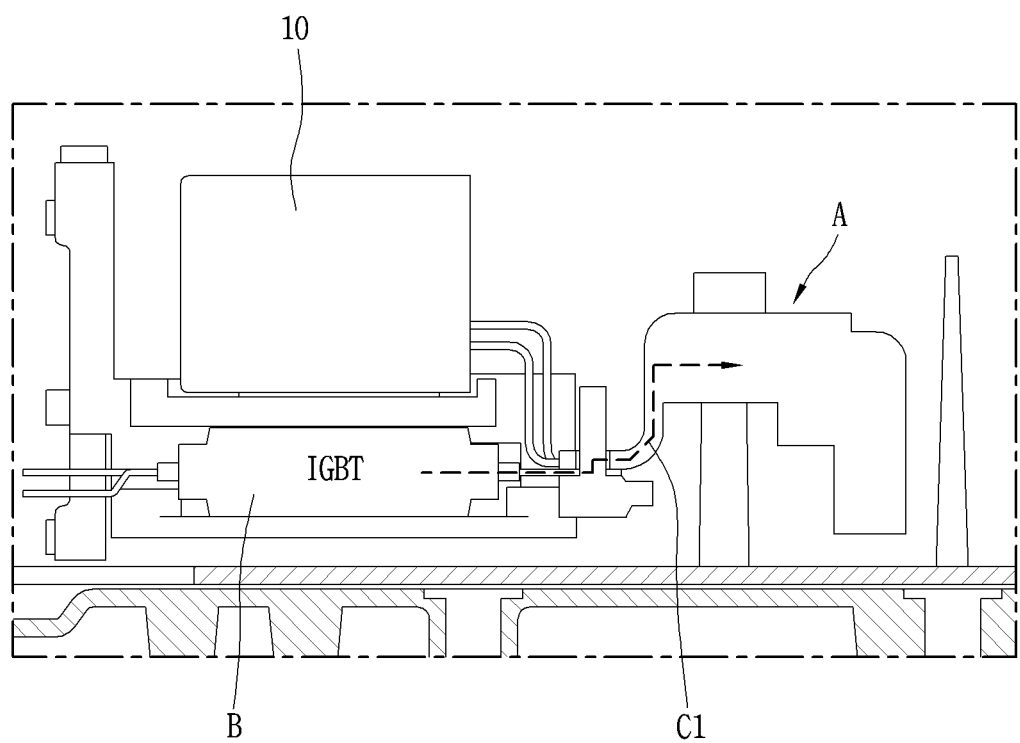

FIG. 1 is a diagram illustrating an integrated power equipment according to an embodiment of the present disclosure. FIG. 2 is a diagram illustrating an inverter assembly according to an embodiment of the present disclosure. FIG. 3 is an exploded perspective view illustrating the inverter assembly 1 of FIG. 2. FIGS. 4 and 5 are diagrams for explaining a direction in which current C1 flows in the inverter assembly 1.

Referring to FIG. 1, an integrated power device 1000 is illustrated. The integrated power device 1000 may include an auxiliary power module (APM) assembly, a charging module, the inverter assembly 1, and a battery disconnect unit (BDU) assembly configured to distribute power to each module. The integrated power device 1000 is surrounded by a top cover assembly 1001 and an integrated module housing 1002.

Referring to FIGS. 2 and 3, the inverter assembly 1 included in the integrated power device 1000 is illustrated. The inverter assembly 1 is configured to control current supplied to a motor, and may include a bulk capacitor 10 configured to store energy (power) for driving an inverter, a direct current bus bar assembly 20, a control board 30, a gate board 40, a top compressor 50, a power module assembly 60, and a bottom compressor 70.

In addition, current C1 supplied from the bulk capacitor 10 to the motor may be delivered to a bus bar 300 via a power semiconductor module B (Insulated-gate bipolar transistor (IGBT)). In this process, the current C1 flowing through the bus bar 300 may pass through a current sensor assembly A.

Figure 6:
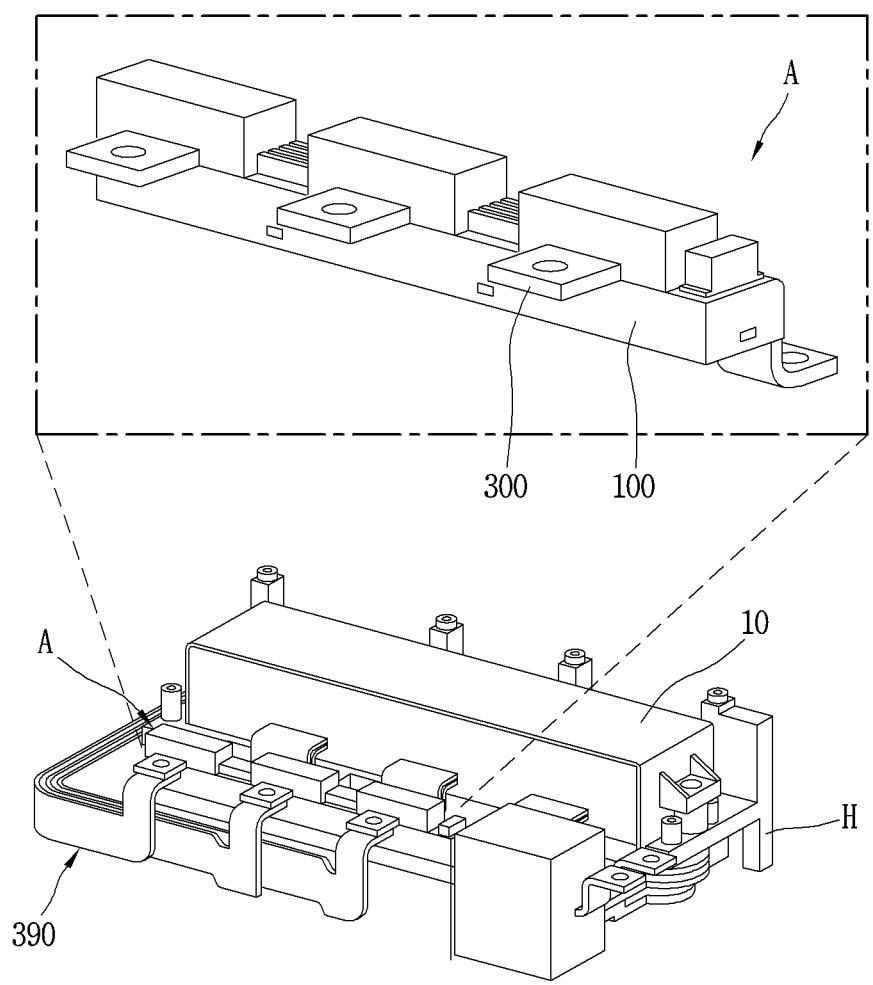
FIG. 6 is a diagram illustrating a current sensor assembly according to an embodiment of the present disclosure.
Figure 7:
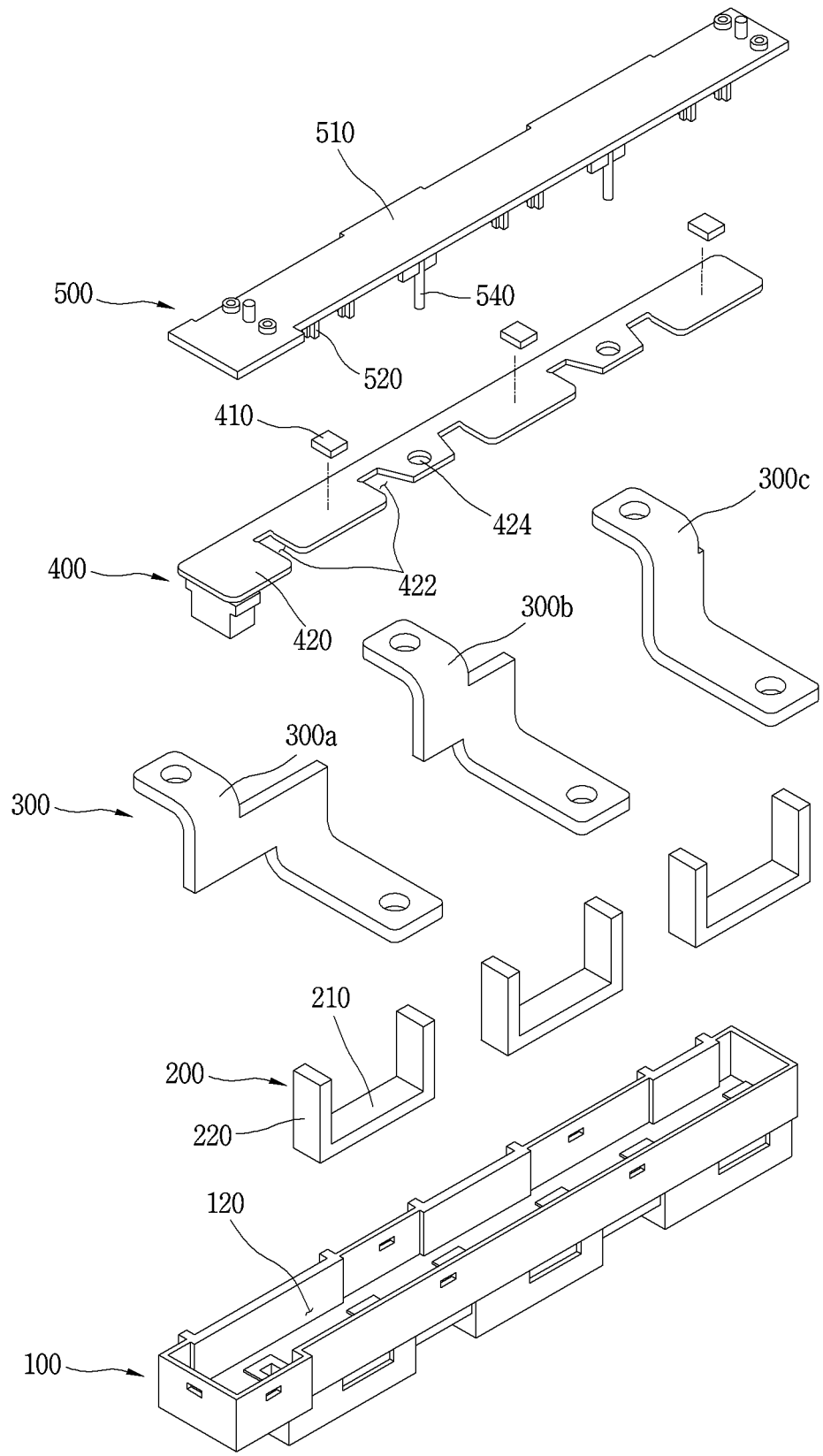
FIGS. 7 and 8 are exploded perspective views illustrating the current sensor assembly of FIG. 6.
Figure 8:
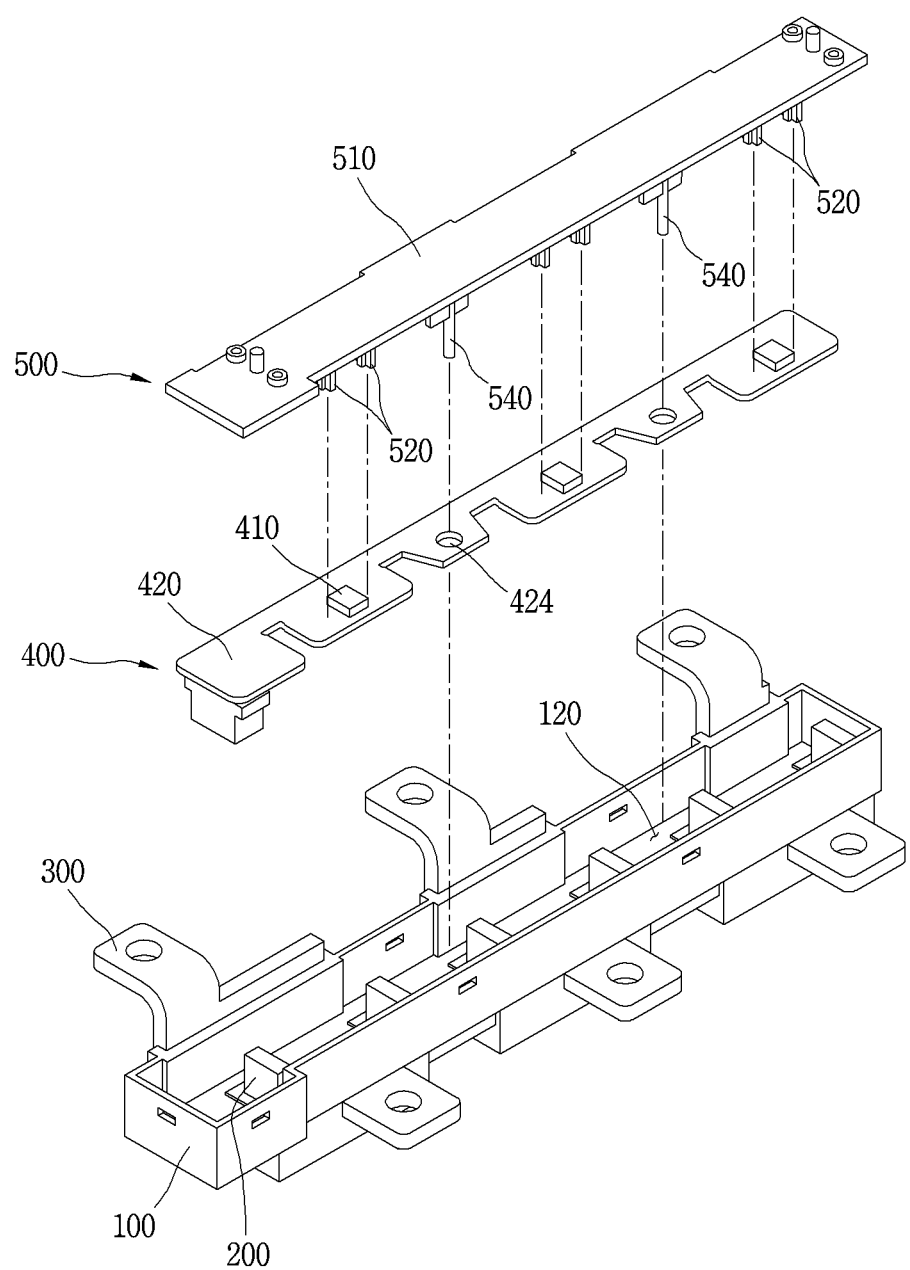
Figure 9:
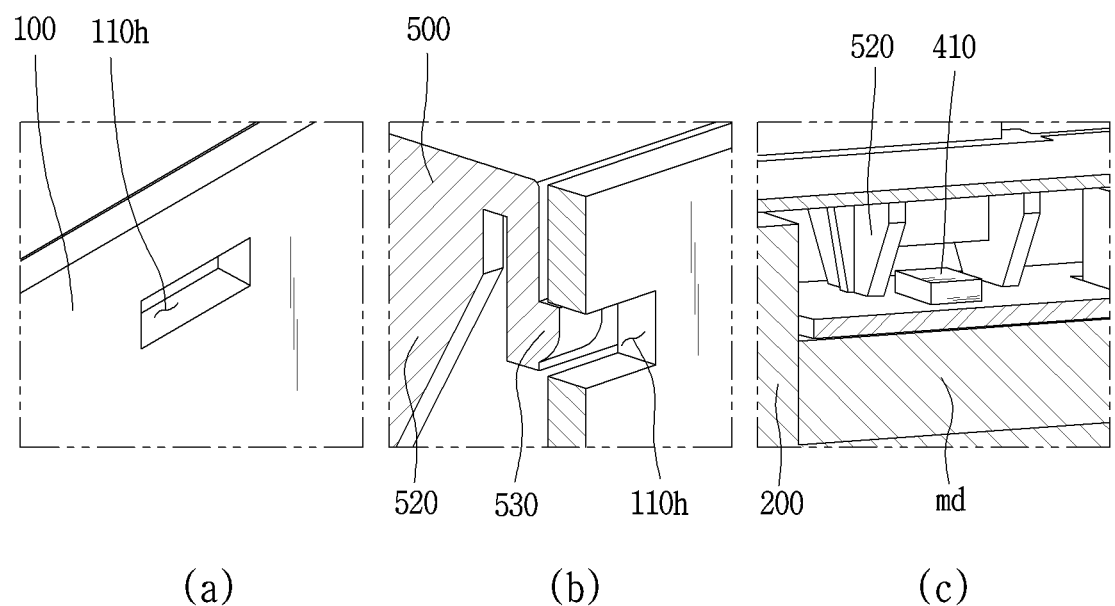
FIG. 9 is a diagram for explaining that a housing cover coupled to a rear surface of a housing and a support protrusion portion protruding from the housing cover support a printed circuit board.
Figure 10:
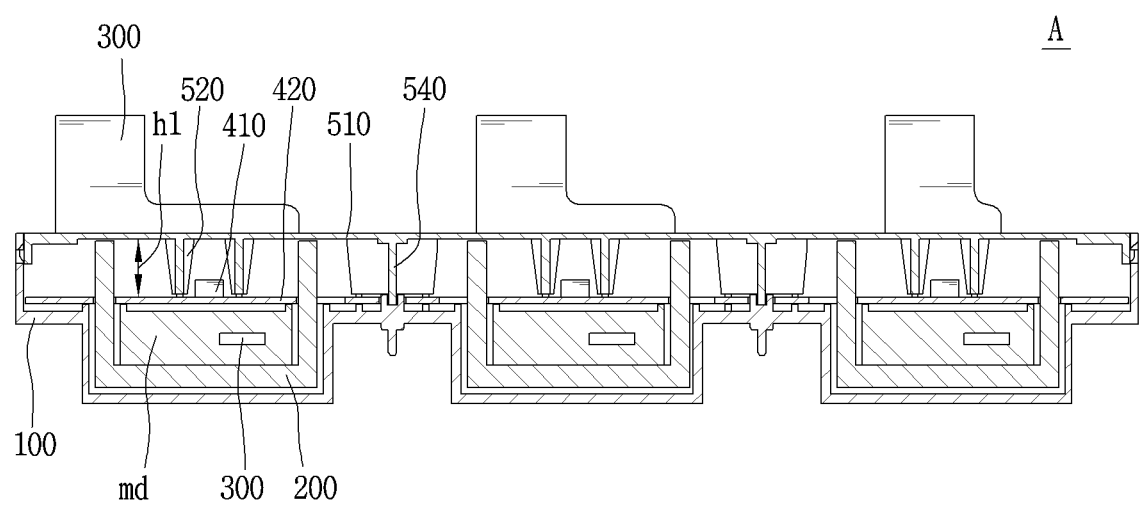
FIG. 10 is a cross-sectional view for explaining the current sensor assembly of FIG. 6.

FIG. 6 is a diagram illustrating the current sensor assembly A according to an embodiment of the present disclosure. FIGS. 7 and 8 are exploded perspective views illustrating the current sensor assembly A of FIG. 6. FIG. 9 is a diagram for explaining that a housing cover 500 coupled to a rear surface of a housing 100 and a support protrusion portion 520 protruding from the housing cover 500 support a printed circuit board 420. FIG. 10 is a cross-sectional view for explaining the current sensor assembly A of FIG. 6.

Referring to FIG. 6, the current sensor assembly A according to an embodiment of the present disclosure is arranged in a process in which current flows from the bulk capacitor 10 configured to store energy (power) for driving an inverter to an assembly 390 of the bus bar 300. The bulk capacitor 10, the current sensor assembly A, and the assembly 390 of the bus bar 300 may be arranged to be coupled to a housing H.

Referring to FIG. 7, the current sensor assembly A according to an embodiment of the present disclosure includes the housing 100, a shield 200, the bus bar 300, and a current sensor unit 400.

The housing 100 has an approximate rectangular cross section. An inner space 120 in which the shield 200, the bus bar 300, and the current sensor unit 400 may be accommodated may be provided in the housing 100. The shield 200, the bus bar 300, and the current sensor unit 400 may be sequentially accommodated in the inner space 120 in an upward direction.

The housing 100 may further include the housing cover 500. The housing cover 500 may be coupled to an upper end of the housing 100 to cover the inner space 120 of the housing 100.

In detail, a housing groove 110h may be provided in a rear surface of the housing 100. In addition, the housing cover 500 may extend in a downward direction from a main body 510 of the housing cover 500, and may include a fixing projection portion 530 provided to fit into the housing groove 110h. As illustrated in FIG. 9, when the housing cover 500 is arranged to cover the inner space 120 of the housing 100, the fixing projection portion 530 of the housing cover 500 may be connected to the housing groove 110h to engage the housing 100 with the housing cover 500.

The housing cover 500 may extend in a downward direction to include the support protrusion portion 520 in contact with the printed circuit board 420.

In detail, as illustrated in FIG. 7, the support protrusion portion 520 protrudes in a downward direction from the main body of the housing cover 500. In addition, as illustrated in FIG. 9C, when the housing cover 500 is coupled to the housing 100, the support protrusion portion 520 may be in contact with the printed circuit board 420.

To do so, the support protrusion portion 520 may be provided to have a length slightly greater than a distance h1 between an inner side of the main body of the housing cover 500 and the printed circuit substrate 420. For example, the support protrusion portion 520 may be provided to be about 2 mm longer than the distance h1 between the inner side of the main body of the housing cover 500 and the printed circuit substrate 420.

Since the support protrusion portion 520 supports the printed circuit board 420, vibration of the current sensor 410 in the current sensor unit 400, which may be caused by vibration of the current sensor assembly A when the inverter vibrates according to driving of the inverter, may be reduced. Thus, an error that may be generated due to the vibration of the current sensor 410 during measurement of current supplied to the bus bar 300 may be reduced.

A plurality of shields 200 are provided. The shields 200 may be accommodated in the housing 100, and arranged to open toward a top of the housing 100.

The shields 200 include inner side surfaces (base) 210 arranged inside the housing 100 and protruding surfaces (protruding sides) 220 protruding from opposite sides of the inner side surfaces 210. In this case, open portions of the shields 200 which are not surrounded by three surfaces of the shields 200 are arranged toward the top of the housing 100. However, an installation direction of the housing 100 may vary according to a design.

Inner portions of the shields 200 refer to regions surrounded by the inner side surfaces 210 and the protruding surfaces 220 of the shields 200. In addition, each of the regions provided by the inner portions of the shields 200 may be understood as a volume of each of the shields 200. The volume of each of the shields 200 is relevant to a magnitude of current measured by the current sensor 410 arranged in each of the shields 200. This will be described later in detail. The bus bar 300 is arranged to pass through inside of each of the shields 200.

A plurality of bus bars 300 are provided. Three-phase current is applied to each of the bas bars 300. The bus bars 300 are arranged near the inner side surfaces 210 and spaced apart from each other to pass through the shields 200, respectively.

In detail, as illustrated in FIG. 7, first to third bus bars 300a to 300c may be arranged. Currents with different phase may flow to the bus bars 300, respectively. For example, U-phase current may flow to the first bus bar 300a, V-phase current may flow to the second bus bar 300b, and W-phase current may flow to the third bus bar 300c.

In detail, a power module including the bulk capacitor 10 may provide three-phase power by supplying three phase currents to drive the motor.

The three-phase power includes three symmetrical sine waves having different phases by an electrical angle of 120 degrees, respectively. For example, in a symmetrical three-phase power supply system, three conductors deliver alternate current with a same frequency and a same voltage amplitude but with a phase difference by ⅓ of a cycle, with reference to a common reference. Due to the phase difference, a voltage on an arbitrary conductor reaches a peak after ⅓ of a cycle of another conductor and before ⅓ of a cycle of the other conductor. Such phase delay provides constant power to a balanced linear load. In addition, a rotating magnetic field may be generated in an electric motor and another phase array may be generated using a transformer.

The current sensor unit 400 may include the printed circuit board 420 and a plurality of current sensors 410.

The plurality of current sensors 410 are arranged on the printed circuit board 420. The current sensors 410 measure current flowing through the bus bars 300. According to a type of the current sensors 410, a magnitude of current that may be measured may vary. For example, the current sensors 410 that may measure a magnetic flux density of 60 mT may be used, or a magnetic flux density equal to or greater than 60 mT or a magnetic flux density less than 60 mT may be measured.

The current sensors 410 are spaced apart from the bus bars 300 and arranged in the inner space 120 of the housing 100. The current sensors 410 are arranged between the protruding surfaces 220 of the shields 200. In detail, referring to FIG. 7, the shields 200 are inserted into the housing 100. In addition, the bus bars 300 are arranged to pass over the shields 200. In addition, the current sensor unit 400 is arranged to be apart from the bus bars 300 by a certain distance. In this case, the current sensors 410 are arranged in regions surrounded by three surfaces of the shields 200.

The plurality of current sensors 410 are arranged to be apart from each other on the printed circuit board 420.

Grooves through which the shields 200 may pass may be provided in the printed circuit board 420. In detail, as illustrated in FIG. 7, first grooves 422 through which the shields 200 may pass may be provided in the printed circuit board 420.

In addition, second holes 424 into which fixing protrusion portions 540 protruding from the housing cover 500 are inserted may be provided in the printed circuit board 420. The printed circuit board 420 may be fixed to the inner space 120 of the housing 100 by using the fixing protrusion portions 540. In addition, a mold unit and may be provided in the inner space 120 of the housing 100 to fix the housing 100, the shields 200, and the bus bars 300.

In the current sensor assembly A according to an embodiment of the present disclosure, the shields 200, the bus bars 300, and the current sensor unit 400 are stacked and fixed in one housing 100. Thus, an error that may occur when the current sensor assembly A is divided into two or more configurations may be reduced. In addition, a design may be performed such that the shields 200, the bus bars 300, and the current sensor unit 400 are arranged close to each other in the inner space 120 of one housing 100 to minimize various problems that may occur when the current sensors 410 measure current.

Figure 11:
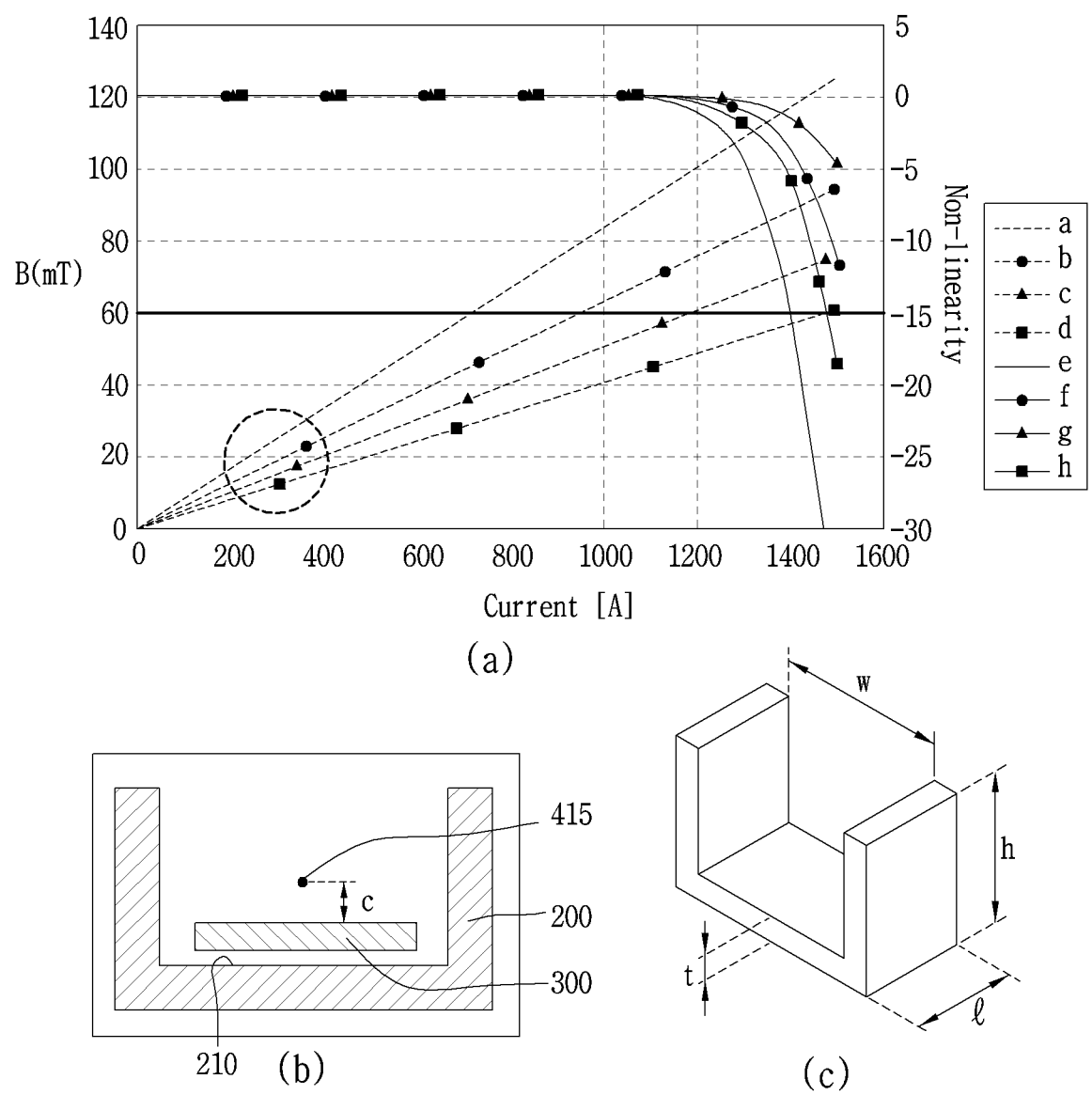
FIGS. 11 and 12 are diagrams for explaining a range of current that may be measured by a current sensor according to locations of a bus bar and the current sensor and a volume of a shield.
Figure 12:
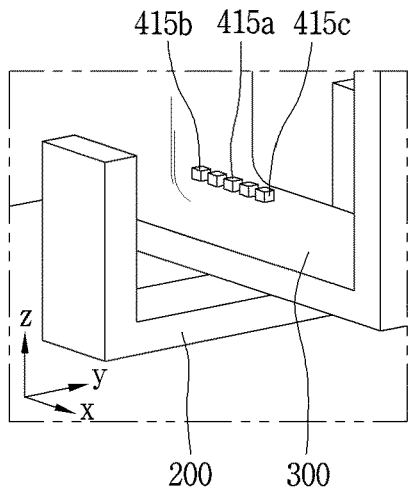
Figure 12:
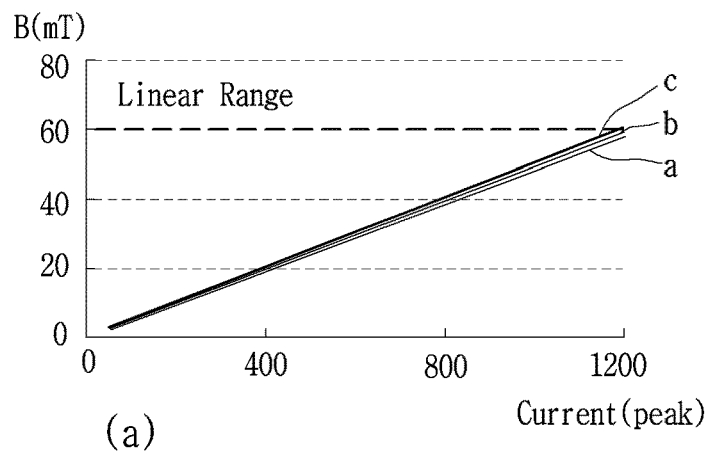
Figure 12:
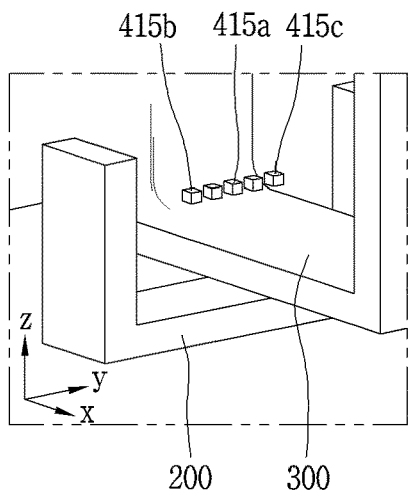
Figure 12:
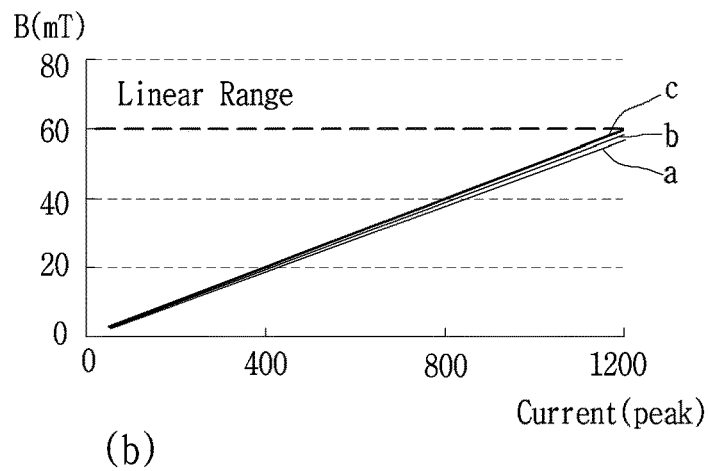
Figure 12:
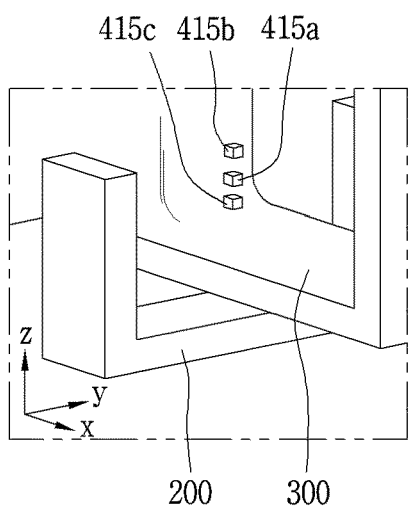
Figure 12:
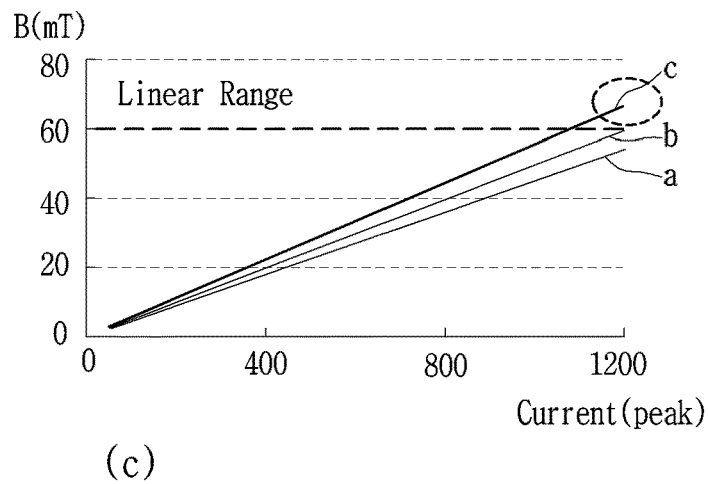

FIGS. 11 and 12 are diagrams for explaining a range of current that may be measured by the current sensors 410 according to locations of the bus bars 300 and the current sensors 410 and volumes of the shields 200.

A volume of a shield 200 according to an embodiment of the present disclosure may be provided within a range in which a linearity in a numerical range, in which current supplied to the bus bar 300 is measured by the current sensor 410, may be ensured within a range of current passing through the bas bar 300. Thus, the volume of the shield 200 may be selected within a magnetic range in which the current sensor 410 may measure current.

The volume of the shield 200 is estimated by a width w and a thickness t of the shield 200 and a length h of the protruding surfaces 220. In detail, referring to (c) of FIG. 11, a product of the width w, length l, and height h-t of the shield 200 may be the volume of the shield 200.

Referring to (a) of FIG. 11, a vertical axis of the table indicates a magnetic flux density measured by the current sensor 410 according to volumes of the shields 200. In detail, lines a to d each indicate a magnetic flux density measured by the current sensors 410, according to lengths of inner widths of the shields 200 having a same thickness t of the shields 200 and a same height of the protruding surfaces 220. In addition, a horizontal axis of the table indicates current supplied to the bus bars 300.

For example, the line a indicates a case when the inner width of the shield 200 is about 15 mm, the line b indicates a case when the inner width of the shield 200 is about 20 mm, the line c indicates a case when the inner width of the shield 200 is about 25 mm, and the line d indicates a case when the inner width of the shield 200 is about 30 mm.

Lines e to f indicate magnitudes of magnetic flux densities measured at inner surfaces of the shields 200 when lengths of the inner side surfaces 210 of the shields 200 are about 15 mm, 20 mm, 25 mm, and 30 mm, respectively. When about 1200 A is exceeded, in all of the four cases described above, the magnetic flux density drastically decreases.

According sizes and performance of the current sensors 410, the current sensors 410 may have a maximum magnetic density needed to linearly measure the current supplied to the bus bars 300. For example, in a case of the current sensors 410 with a product name of MLX91208CAV, when the current supplied to the bus bars 300 is about 1200 A, the maximum magnetic density may be about 50 mT to about 100 mT according to lengths of the inner widths of the shields 200 measured by the current sensors 410.

The current sensors 410 described above may linearly measure a magnetic flux density of up to about 60 mT. Accordingly, the lengths of the inner side surfaces 210 of the shields 200 may be desirably about 25 mm or about 30 mm. In addition, the volumes of the shields 200 may be selected within a range in which the current sensors 410 may linearly measure the current supplied to the bus bar 300. In this example, the lines c and d may be selected.

First to third axes inside the housing 100 may be defined as follows.

The first axis is in a direction in which the bus bars 300 are spaced apart from the shields 200 and pass over the inner side surfaces 210 of the shields 200. For example. referring to (a) of FIG. 12, the first axis is in a direction of an x-axis. The second axis is in a direction in which the inner side surfaces 210 of the shields 200 extend. Referring to (b) of FIG. 12, the second axis is in a direction of a y-axis. The third axis is in a direction in which the protruding surfaces 220 at both ends of the shields 200 extend. Referring to (c) of FIG. 12, the third axis is in a direction of a z-axis.

The shields 200 and the bus bars 300 may be spaced apart from each other in a direction of the third axis by a first distance to ensure linearity in a numerical range in which current supplied to the bus bars 300 is measured by the current sensors 410, within a range of current passing through the bas bars 300. In detail, referring to (b) of FIG. 11, a distance from inner surfaces of the shields 200 to the bus bars 300 may be referred to as a first distance in the direction of the third axis. This will be described later in detail with reference to FIGS. 17 and 18.

In addition, the current sensors 410 may be spaced apart from the bus bars 300 by a second distance in the direction of the third axis to maintain linearity of measured current within a range of the current passing through the bus bars 300. In detail, in (b) of FIG. 11, a distance c from surfaces of the bus bars 300 to current sensor center portions 415 may be understood as the second distance in the direction of the third axis.

FIG. 12 illustrates an amount of current measured by the current sensors 410 according to changes in relative positions of the bus bars 300 and the current sensor center portions 415 along the first to third axes.

In detail, (a) of FIG. 12 illustrates magnetic flux densities measured by the current sensor 410 in respective positions with reference to the first position 415a on the bus bar 300 along the first axis (the x-axis) when the current sensor center portion 415 is located in the respective different positions.

When the current sensor 410 is located in the first position 415a, a second position 415b, and a third position 415c, magnetic flux densities measured by the current sensor 410 in the first to third positions 415a to 415c correspond to lines a to c, respectively. In this case, there is very little difference between the magnetic flux densities measured by the current sensor 410 in the first position 415a, the second position 415b, and the third position 415c, respectively.

In detail, (b) of FIG. 12 illustrates magnetic flux densities measured by the current sensor 410 in respective positions with reference to the first position 415a on the bus bar 300 along the second axis (the y-axis) when the current sensor center portion 415 is located in the respective different positions. In this case, there is very little difference between the magnetic flux densities measured by the current sensor 410 in the first position 415a, the second position 415b, and the third position 415c, respectively.

In detail, (c) of FIG. 12 illustrates magnetic flux densities measured by the current sensor 410 in respective positions with reference to the first position 415a on the bus bar 300 along the third axis (the z-axis) when the current sensor center portion 415 is located in the respective different positions. The first position 415a is a position of the current sensor center portion 415 being spaced apart from the bus bar 300 by a reference distance. The second position 415b is a position of the current sensor center portion 415 being spaced far apart from the bus bar 300. The third position 415c is a position of the current sensor center portion 415 being arranged nearer the bus bar 300 than in the first position 415a.

In a case when the current sensor center portion 415 is located in the third position 415c nearer the bus bar 300 than in the first position 415a, when current of about 1200 A flows through the bus bar 300, a magnetic flux density measured by the current sensor 410 may exceed 60 mT. This is because a magnetic field according to the current flowing through the bus bar 300 is strong when the current sensor center portion 415 is arranged near the bus bar 300. Accordingly, with respect to the magnetic range, it is desirable that the current sensor center portion 415 is arranged apart from the bus bar 300 by a certain distance rather than being arranged near the bus bar 300.

The current sensor assembly A according to an embodiment of the present disclosure may easily determine an optimum volume of the shield 200 such that the current sensor 410 may linearly measure current flowing through the bus bar 300. Further, the current sensor assembly A may easily determine a range in which the current sensor 410 may linearly measure current according to a position relationship between the bus bar 300 and the current sensor center portion 415 to optimize positions of the bus bar 300 and the current sensor 410.

Figure 13:
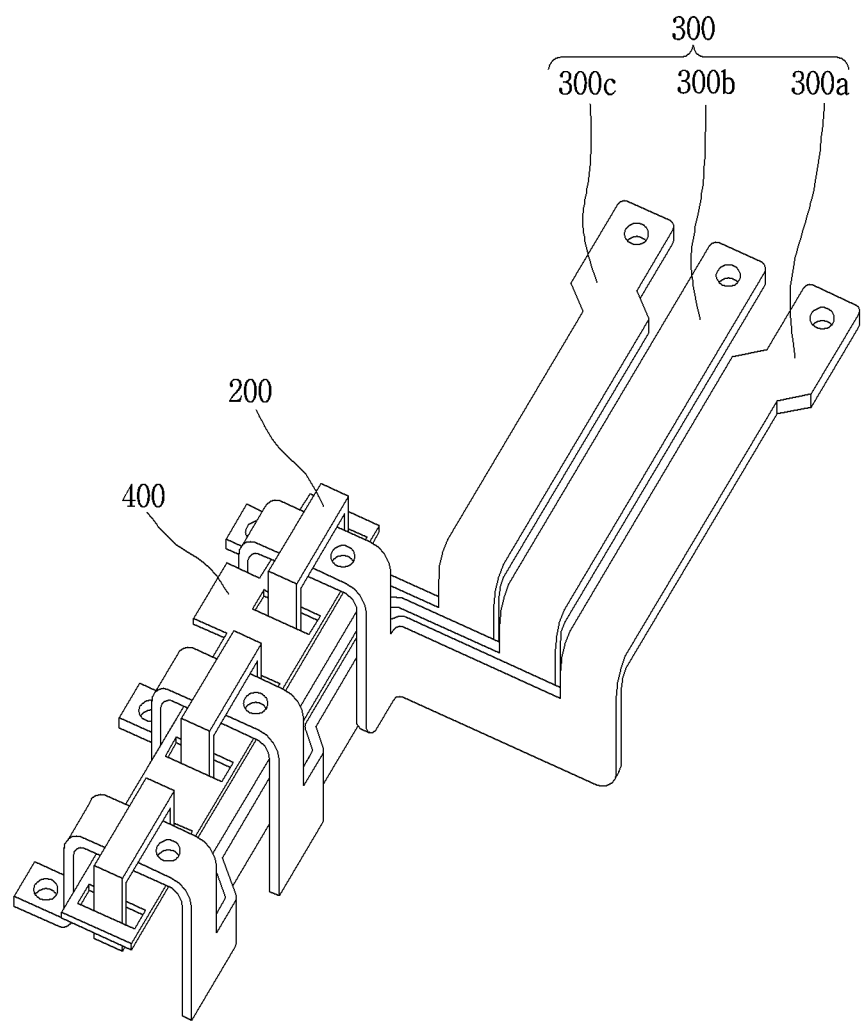
FIGS. 13 and 14 are diagrams for explaining a crosstalk generated in one current sensor according to relative positions of the shield and the current sensor.
Figure 14:
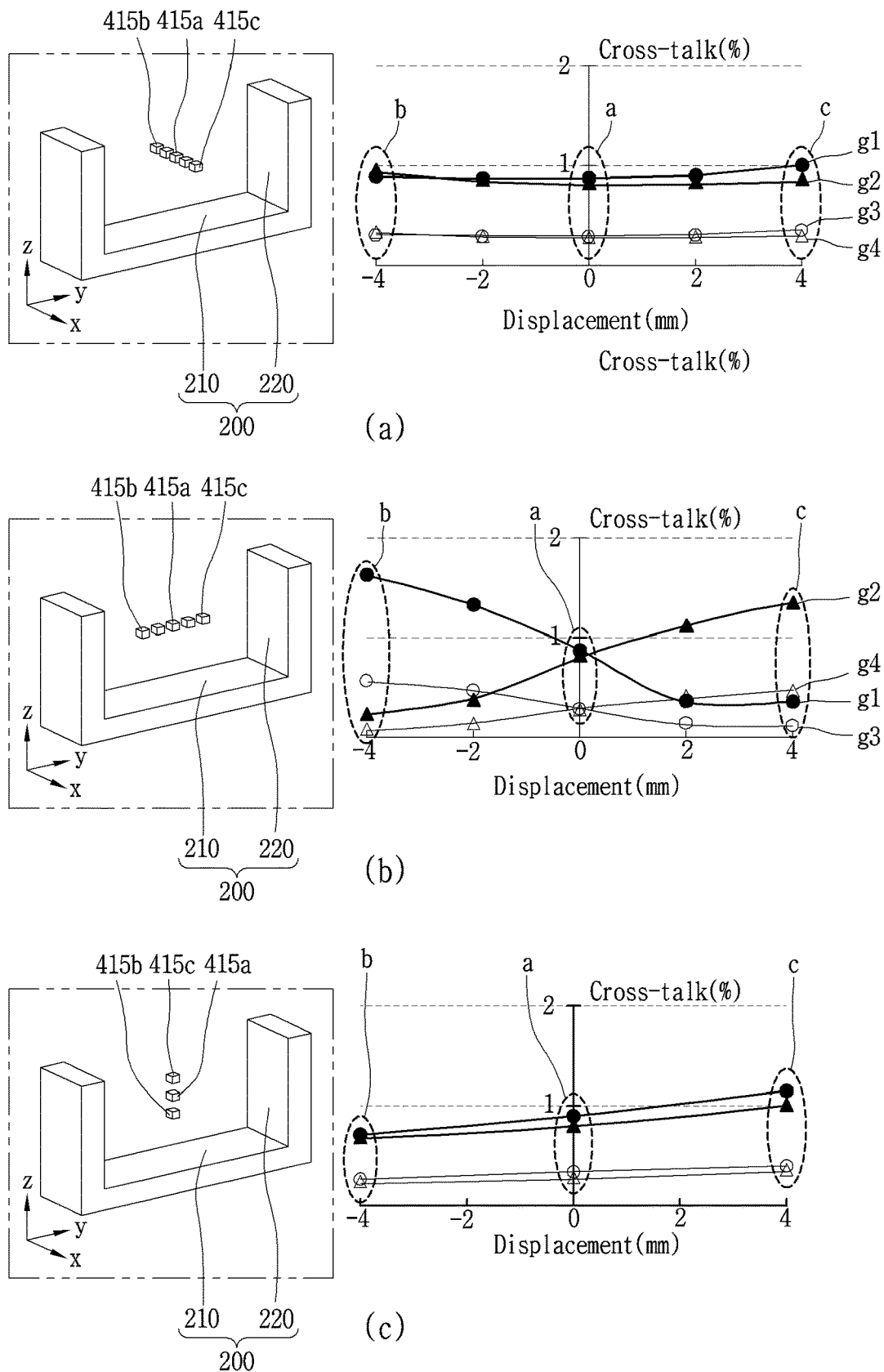

FIGS. 13 and 14 are diagrams for explaining a crosstalk generated on one current sensor 410 according to relative positions of the shield 200 and the current sensor 410.

Referring to FIG. 13, the bus bar 130 may include the first bus bar 300a, the second bus bar 300b, and the third bus bar 300c through which U-phase current, V-phase current, and W-phase current flow, respectively. In this case, the current sensor 410 arranged over one bus bar 300 such as the first bus bar 300a, the second bus bar 300b, or the third bus bar 300c may measure current flowing through another bus bar 300 adjacent to the bus bar 300 on which the current sensor 410 is arranged. This may be referred to a crosstalk.

To minimize the crosstalk, the plurality of current sensors 410 arranged in correspondence to the plurality of the bus bars 300 providing the three phases, respectively, may be arranged adjacent to centers between the protruding surfaces 220 of the plurality of shield 200 surrounding the current sensors 410, respectively.

In detail, (a) of FIG. 14 illustrates a degree of a crosstalk generated in the current sensor 410 in respective positions with reference to the first position 415a between the protruding surfaces 220 of the shield 200 along the first axis (the x-axis) when the current sensor center portion 415 is located in the respective different positions.

Points g1 to g4 indicate a crosstalk effect between the first bus bar 300a and the second bus bar 300b, a crosstalk effect between the first bus bar 300a and the third bus bar 300c, and a crosstalk effect between the second bus bar 300b and the third bus bar 300c, respectively. In addition, crosstalk effects generated in a region a, a region b, and a region c indicate crosstalk effects generated in the first position 415a, the second position 415b, and the third position 415c, respectively.

When the current sensor 410 is positioned in the first position 415a, the second position 415b, or the third position 415c between the protruding surfaces 220 of the shield 200, respectively, a difference between the crosstalk effects generated in the first to third positions 415a, 415b, and 415c is not significant. A crosstalk effect in the first position 415a that is a reference position is least. Accordingly, a crosstalk effect is least when the current sensor 410 is arranged in the first position 415a between the protruding surfaces 220 in a direction of the first axis.

In detail, (b) of FIG. 14 illustrates a degree of a crosstalk generated in the current sensor 410 in respective positions with reference to the first position 415a between the protruding surfaces 220 of the shield 200 along the second axis (the y-axis) when the current sensor center portion 415 is located in the respective different positions.

A crosstalk effect in the second or third position 415b or 415c is great compared to a cross effect in the first position 415a. Accordingly, the current sensor 410 may not measure an accurate current value of the corresponding bus bar 300. Accordingly, a crosstalk effect is least when the current sensor 410 is arranged in the first position 415a between the protruding surfaces 220 in a direction of the second axis.

In detail, (c) of FIG. 14 illustrates a degree of a crosstalk generated in the current sensor 410 in respective positions with reference to the first position 415a between the protruding surfaces 220 of the shield 200 along the third axis (the z-axis) when the current sensor center portion 415 is located in the respective different positions.

It may be understood that a crosstalk effect increases in an order from a case when the current sensor center portion 415 is located in the second position 415b, a case when the current sensor center portion 415 is located in the first position 415a, to a case when the current sensor center portion 415 is located in the third position 415c. This is because a shield effect that may be exerted on the current sensor 410 by the protruding surfaces 220 is small when the current sensor center portion 415 is far apart from the inner side surface 210 of the shield 200. Accordingly, an influence exerted on the current sensor 410 by current flowing through the adjacent bus bar 300 may be great. Accordingly, a crosstalk effect is least when the current sensor 410 is arranged in the second position 415b between the protruding surfaces 220 in a direction of the third axis.

That is, it may be desirable that the current sensor 410 is arranged to be apart from a surface of the inner side surface 210 of the shield 200 in the third axis by a third distance. In this case, the third distance will be described later in detail with reference to FIGS. 17 and 18.

The current sensor assembly A according to an embodiment of the present disclosure may measure and take into account respective crosstalk effects with respect to the first to third axes of the current sensor 410 positioned in the protruding surfaces 220 of the shield 200. By doing so, the current sensor assembly A may accurately measure current flowing through the bus bar 300 by easily determining a position of the current sensor 410 for minimizing a crosstalk effect generated by the adjacent bus bar 300 and adjusting positions of the current sensor 410 and the shield 200.

Figure 15:
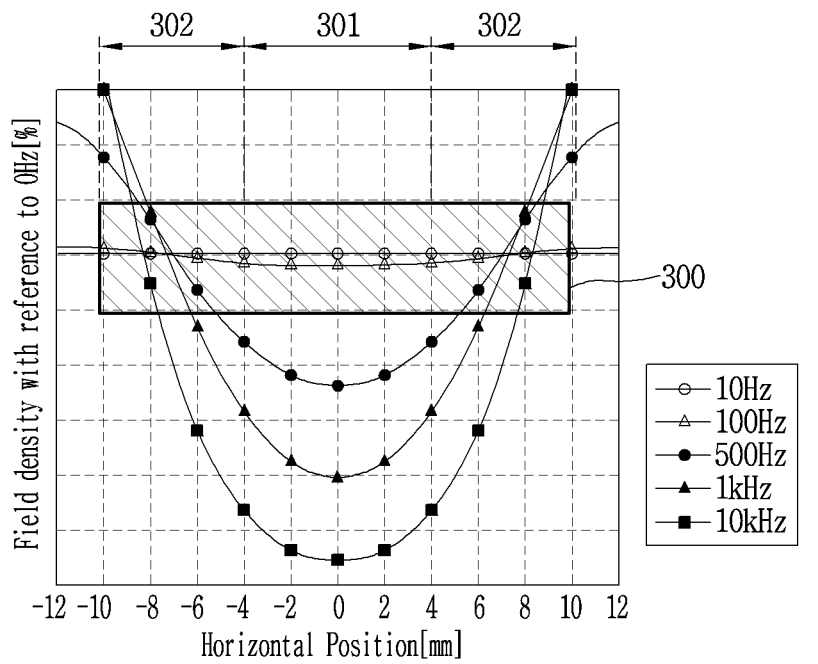
FIGS. 15 and 16 are diagrams for explaining a skin effect and phase delay, both being generated according to a frequency of current passing through the bus bar.
Figure 15:
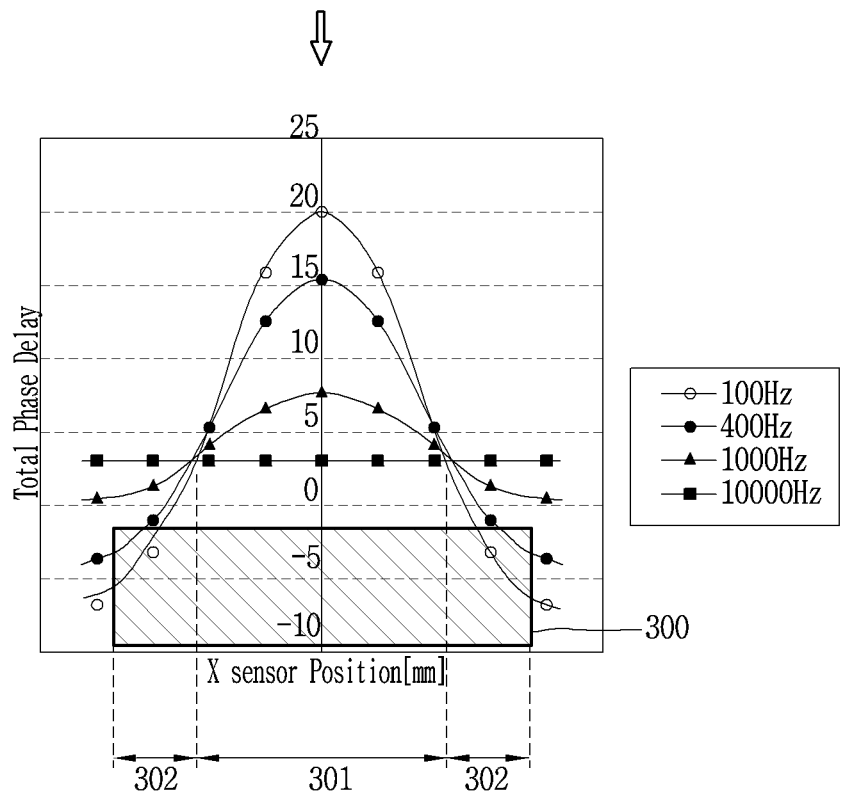
Figure 16:
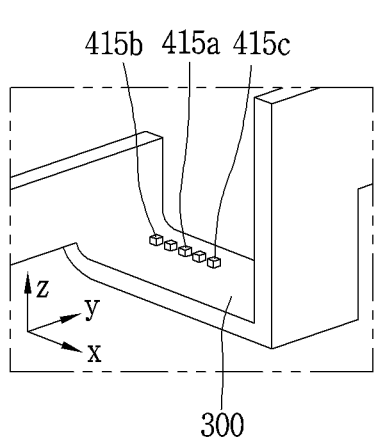
Figure 16:
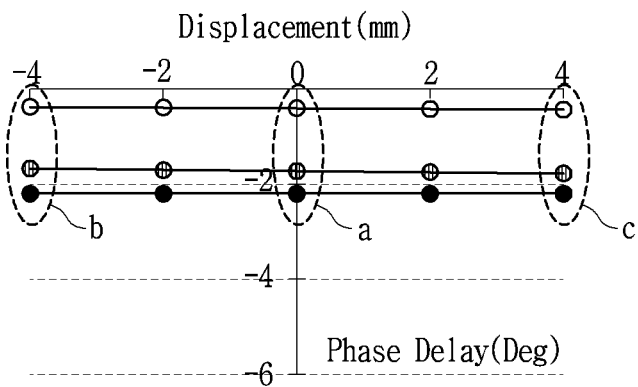
Figure 16:
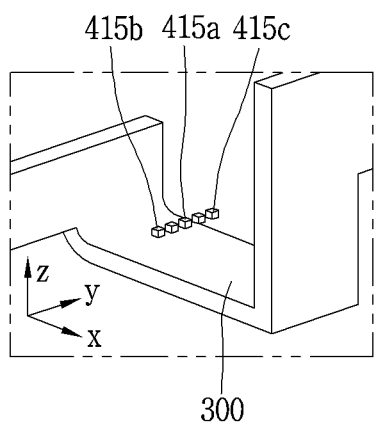
Figure 16:
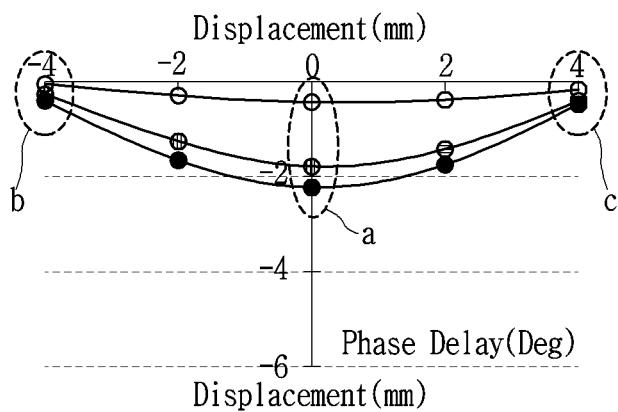
Figure 16:
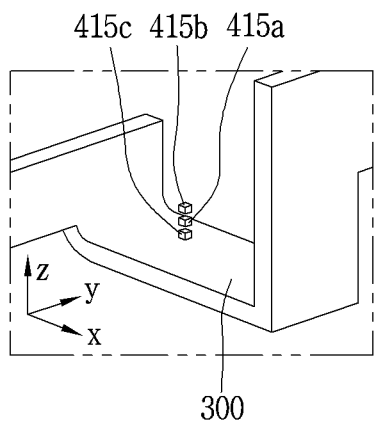
Figure 16:
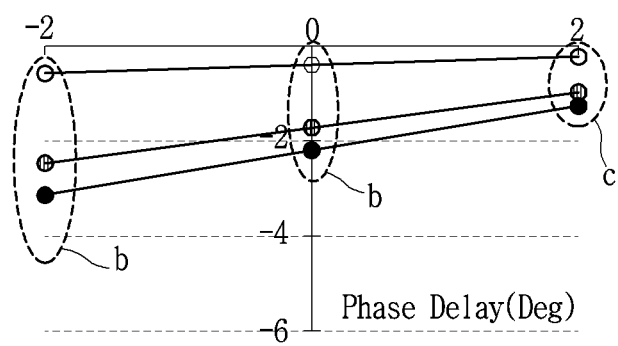

FIGS. 15 and 16 are diagrams for explaining a skin effect and phase delay generated according to a frequency of current passing through the bus bar 300.

An upper drawing in FIG. 15 illustrates a magnetic flux density generated according to each position of the bus bar 300 according to a frequency of current flowing through the bus bar 300. Referring to the upper drawing in FIG. 15, as a frequency of current increases, a magnetic flux density in a central region 301 of the bus bar 300 drastically decreases. In addition, as the frequency of current increases, a magnetic flux density in an outer region 302 of the bus bar 300 greatly increases. This may be referred to as a skin effect.

In addition, a lower drawing in FIG. 15 illustrates phase delay generated in each position of the bus bar 300 according to a frequency of current flowing through the bus bar 300. As described above, when a frequency of current increases, a magnetic flux density in the central region 301 of the bus bar 300 drastically decreases. Accordingly, when the frequency is high, phase delay in the central region 301 of the bus bar 300 may be greater than that in the outer region 302 of the bus bar 300.

To reduce the phase delay described above, the current sensor 410 may be arranged apart from a center of the bus bar 300 along the second axis by a fourth distance.

In detail, (a) of FIG. 16 illustrates a degree of phase delay generated for the current sensor 410 in respective positions with reference to the first position 415a apart from the bus bar 300 along the first axis (the x-axis) when the current sensor center portion 415 is located in the respective positions. The regions a to c indicate degrees of phase delay generated in the first position 415a, the second position 415b, and the third position 415c, respectively.

When the current sensor 410 moves along the first axis, this indicates that the current sensor 410 moves along a central portion of the bus bar 300. Thus, phase delay in the first position 415a, the second position 415b, and the third position 415c are identical to each other. Accordingly, a location of the current sensor 410 with reference to the first position 415a along the first axis does not affect phase delay within a certain distance.

In detail, (b) of FIG. 16 illustrates a degree of phase delay generated for the current sensor 410 in respective positions with reference to the first position 415a on the bus bar 300 along the second axis (the y-axis) when the current sensor center portion 415 is located in the respective positions.

In this case, as the current sensor center portion 415 moves with reference to the first position 415a along the second axis, the current sensor center portion 415 may be moved from the central region 301 of the bus bar 300 to the outer region 302 of the bus bar 300. As described above, a magnetic flux density is high and phase delay occurs little in the outer region 302 of the bus bar 300. Thus, occurrence of phase delay may decrease when the current sensor 410 moves from the first position 415a that is a reference position, the second position 415b, to the third position 415c.

Accordingly, to reduce a phase delay effect, it may be desirable that the current sensor center portion 415, that is, the current sensor 410 moves on the bus bar 300 along the second axis.

The current sensor 410 may be arranged apart from a surface of the bus bar 300 in the third axis by the third distance.

In detail, (c) of FIG. 16 illustrates a degree of phase delay generated for the current sensor 410 in respective positions with reference to the first position 415a on the bus bar 300 along the third axis (the z-axis) when the current sensor center portion 415 is located in the respective positions.

It may be understood that phase delay decreases as the current sensor 410 moves from the first position 415a that is a reference position to the third position 415c arranged near the bus bar 300. In addition, it may be understood that phase delay increases as the current sensor 410 moves from the first position 415a to the second position 415b. This is caused by a reduction in phase delay that occurs in the current sensor 410 as a magnetic flux density of the bus bar 300 increases when the current sensor 410 is arranged near the bus bar 300.

Accordingly, it may be understood that the current sensor center portion 415 may be desirably moved near the bus bar 300 on the bus bar 300 along the third axis to reduce a phase delay effect.

However, as described above, when the current sensor 410 is arranged too close to the bus bar 300, as a magnetic flux density becomes too high, a magnetic flux density that may be linearly measured by the current sensor 410 may be exceeded. Accordingly, it is needed to set a distance for reducing phase delay while a condition for a magnetic flux density that may be measured by the current sensor 410 is met.

The current sensor assembly A according to an embodiment of the present disclosure may be configured such that the current sensor 410 is arranged near the bus bar 300, by taking into account a change in the magnetic flux density according to a skin effect of the bus bar 300. As the current sensor 410 is arranged near an end portion of the bus bar 300, a phase delay effect caused by a magnetic flux density difference may be reduced.

Figure 17:
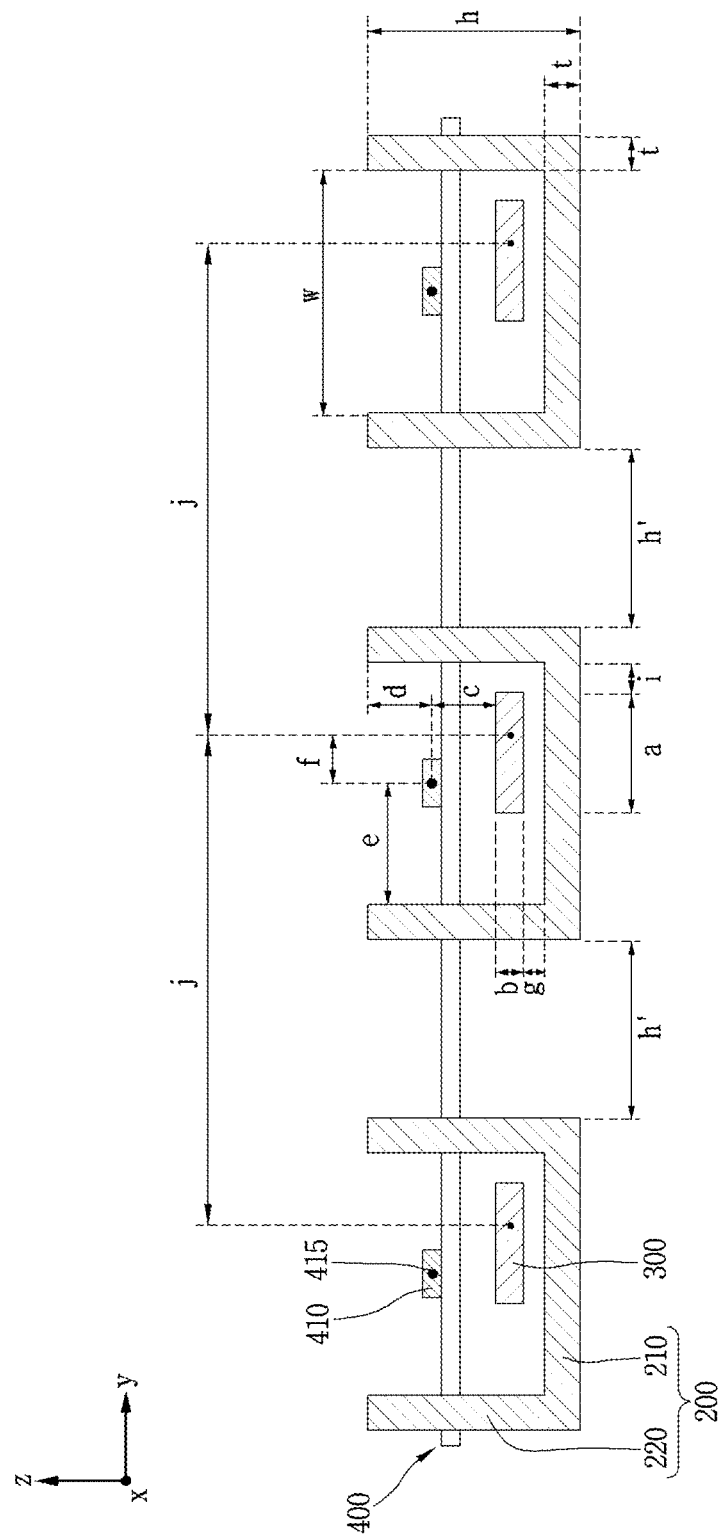
FIGS. 17 and 18 are diagrams for explaining positions of and distances between the shield, the bus bar, and a current sensor unit.
Figure 18:
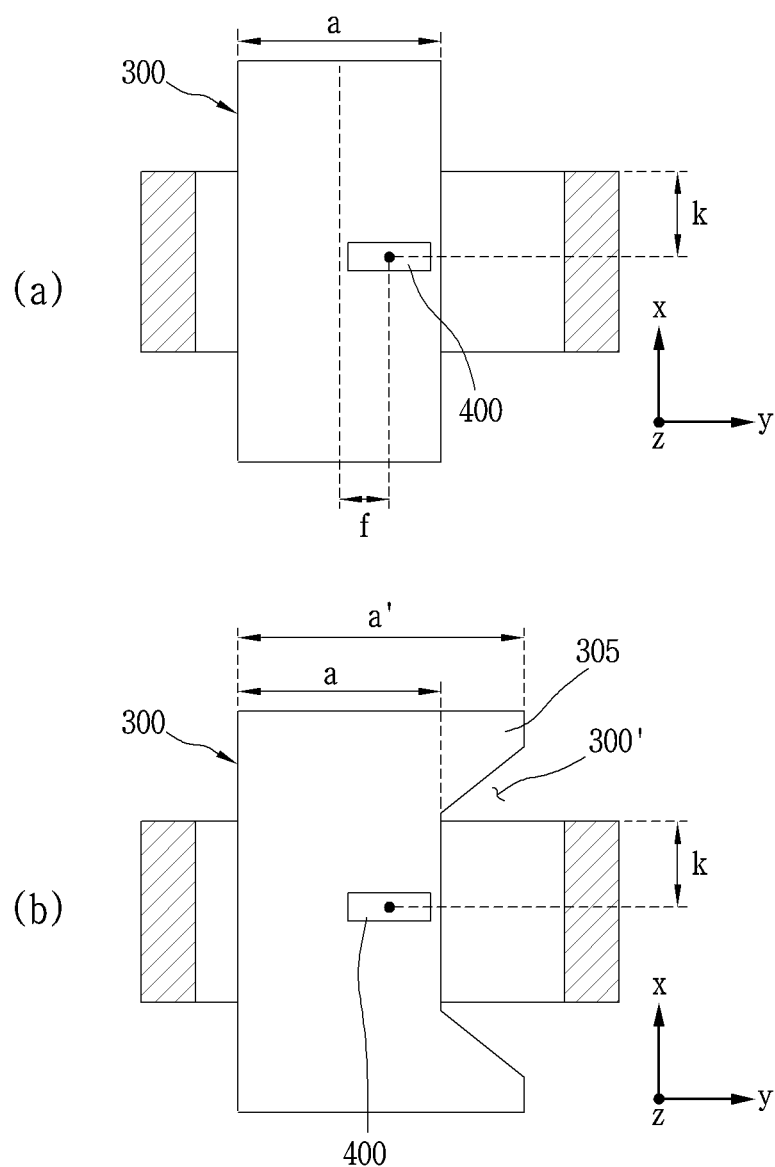

FIGS. 17 and 18 are diagrams for explaining positions of and distances between the shields 200, the bus bars 300, and the current sensor 400.

As described above, the shields 200, the bus bars 300, and the current sensors 410 may be spaced apart from each other in a direction of the first, second, or third axis by a certain distance.

In detail, the shields 200 and the bus bars 300 may be spaced apart from each other in a direction of the third axis by a first distance to ensure linearity of the numerical range in which the current sensors 410 measure current supplied to the bus bars 300 within a range of current passing through the bas bars 300. Referring to FIG. 17, the first distance may be the distance g.

In addition, the current sensors 410 may be spaced apart from the bus bars 300 in a direction of the third axis by a second direction to maintain linearity of measured current within a range of current passing through the bus bars 300. Referring to FIG. 17, the second distance may be the distance c.

That is, the current sensors 410 may be arranged apart from a surface of the inner side surface 210 of the shields 200 in the third axis by a third distance. Referring to FIG. 17, the third distance may be a distance obtained by adding the distances g, b, and c.

In addition, to reduce phase delay, the current sensors 410 may be arranged apart from centers of the bus bars 300 along the second axis by a fourth distance. Referring to FIG. 17, the fourth distance may be a distance f (refer to (a) of FIG. 18).

When the thickness t of the shield 200 is 3 mm, a desirable distance obtained by taking into account all of a magnetic range in which the current sensors 410 may measure current, a crosstalk effect, and a phase delay effect is described below.

The inner width w between the protruding surfaces 220 of the shields 200 may be desirably about 25 mm. The length h of the protruding surfaces 220 of the shields 200 may be desirably about 18 mm. An inner side distance h' between the shields 200 may be desirably about 20 mm.

A horizontal length a of the bus bars 300 may be desirably about 14 mm. A thickness b of the bus bars 300 may be desirably about 3 mm. A distance between surfaces of the bus bars 300 and the current sensor center portion 415 may be desirably about 4.7 mm. A distance i between the surfaces of the bus bars 300 and inner side surfaces of the protruding surfaces 220 at one side may be desirably about 2 mm. A distance j between a bus bar 300 and another bus bar 300 adjacent thereto may be desirably about 51 mm. A distance g between surface of the bus bar 300 and the inner side surface 210 of the shield 200 may be desirably about 2 mm.

A distance d between the current sensor center portion 415 and an end portion of the protruding surface 220 may be desirably about 8.3 mm. A distance e between the current sensor center portion 415 and the inner side surface 220 of the protruding surface 220 may be desirably about 12.5 mm. A distance k between the current sensor center portion 415 and an end portion of the shield 200 may be desirably about 4 mm. The distance f between the current sensor center portion 415 and a central portion of the bus bar 300 may be desirably about 3.5 mm.

However, a desirable distance between the respective elements described above may be changed according to a volume of the shield 200, a measurement capability of the current sensor 410, and a magnitude of current supplied and a frequency applied to the bus bar 300.

In detail, In detail, (b) of FIG. 18 is a diagram illustrating the bus bar 300 according to another embodiment of the present disclosure.

Referring to (b) of FIG. 18, a width of the bus bar 300 may be greater than that in the embodiment described above. In detail, the width of the bus bar 300 may be small in a section in which the bus bar 300 passes through the shield 200. Thus, a magnetic flux density in the bus bar 300 may be increased in the section in which the bus bar 300 passes through the shield 200.

In detail, in the section the bus bar 300 passes through the shield 200, when a width a of the bus bar 300 is 14 mm, a width a' of the bus bar 300 in sections before and after the bus bar 300 passes through the shield 200 may be greater than 14 mm, for example, 16 mm to 18 mm. To provide such a section, bus bar protruding portions 305 of the bus bar 300 may be provided. In addition, a concave portion 300' of the bus bar 300 may be provided between the bus bar protruding portions 305.

However, in the present embodiment, since a phase delay effect decreases in an outer region of the bus bar 300, it may be desirable that the current sensor 410 is arranged at an end portion of the bus bar 300.

Figure 19:
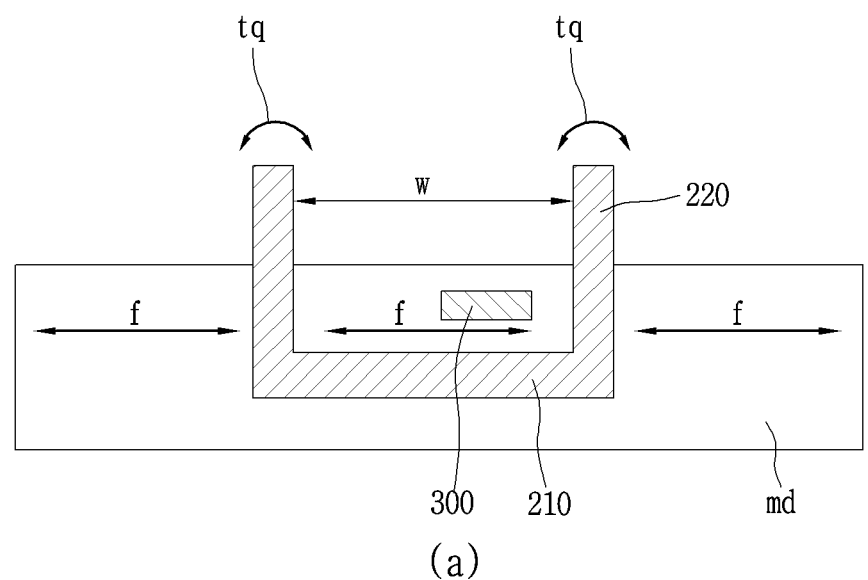
FIG. 19 is a diagram for explaining a mold unit configured to fix fixing the shield and the bus bar to inside of the housing.
Figure 19:
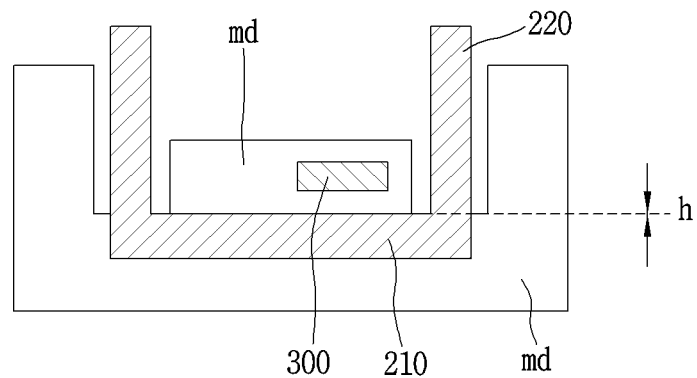
Figure 19:
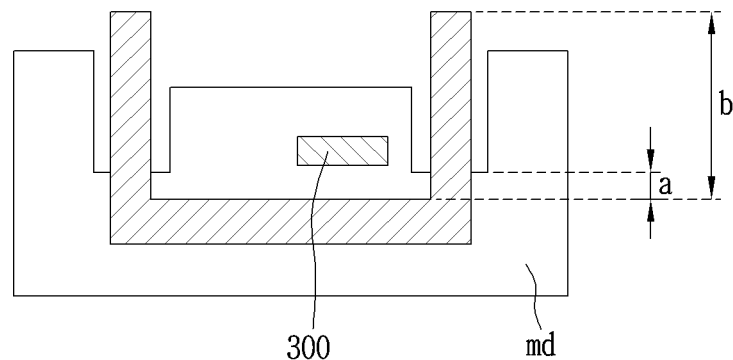

FIG. 19 is a diagram for explaining a mold unit md configured to fix the shield 200 and the bus bar 300 to inside of the housing 100.

The shield 200 and the bus bar 300 according to an embodiment of the present disclosure may be fixed inside the housing 100 by the mold unit md. In detail, after the shield 200 and the bus bar 300 are arranged in the inner space 120 of the housing 100, the mold unit md may be arranged in the inner space 120 of the housing 100 to fix positions of the shield 200 and the bus bar 300.

However, when the mold unit md is provided to surround a large portion of the protruding surfaces 220 of the shield 200 as illustrated in (a) of FIG. 19, a problem described below may occur. In a process in which the mold unit md in a liquid state coagulates to a solid, force f such as heat expansion or shrinkage may occur. The force f on the mold unit md may be applied to the protruding surfaces 220.

A torque tq that is a bending force may occur on the protruding surfaces 220 at opposite sides of the shield 200 according to the force f applied to the protruding surfaces 220 by the mold unit md. According to the torque tq, the protruding surfaces 220 may become apart from each other or close to each other. Thus, a length of the inner width w between the protruding surfaces 220 may vary. When the length of the inner width w between the protruding surfaces 220 changes, a whole volume of the shield 200 may be changed. Accordingly, a magnetic flux density sensed by the current sensor 410 may be affected.

Referring to (b) of FIG. 19, the mold unit md may be provided not to cover the protruding surfaces 220 of the shield 200. Thus, since the protruding surfaces 220 are not affected by heat expansion force or shrinkage force generated as the mold unit md is hardened, the length of the inner width w between the protruding surfaces 220 may be maintained to be constant.

In addition, referring to (c) of FIG. 19, a height a of the protruding portions 220 surrounded by the mold unit md may be provided as being less than 50% of a whole height b of the protruding surfaces 220. Thus, a force provided by the mold unit md to fix the shield 200 may be maximized, and at same time, generation of the torque tq on the protruding surfaces 220 due to force generated by the hardening of the mold unit md may be reduced.

The current sensor assembly A according to an embodiment of the present disclosure is provided such that a large portion of the protruding surfaces 220 is exposed by the mold unit md, and the mold unit md does not excessively surround the protruding surfaces 220. Accordingly, the inner width w between the protruding surfaces 220 is maintained, and thus, the volume of the shield 200 and a shielding ability of the shield 200 may be maintained to be constant.

The current sensor assembly A described above is not limited to the configurations and methods provided in the embodiments described above. A part or whole of the respective embodiments may be selectively combined and configured such that various modifications thereof can be made.

The invention claimed is:

1. A current sensor assembly comprising:
a housing;
a plurality of shields located in the housing, each shield having an inner space open toward a top of the housing;
a plurality of spaced apart bus bars configured to have three phase current applied thereto located in the housing, each bus bar extending through a corresponding shield of the plurality of shields;
a printed circuit board located in the housing; and
a plurality of current sensors located on the printed circuit board, each current sensor being configured to measure a current applied to a corresponding bus bar of the plurality of bus bars, and each current sensor being spaced from the corresponding bus bar in the inner space of the corresponding shield,
wherein each shield includes:
a base located at an inner side of the housing; and
a pair of protruding sides extending from opposite ends of the base,
wherein each bus bar is located near the base of the corresponding shield and extends between the pair of protruding sides of the corresponding shield,
wherein a center of each current sensor is centrally located between the pair of protruding sides of the corresponding shield,
wherein, for each shield, a first axis is defined in a direction in which the corresponding bus bar extends over the base of the shield, a second axis is defined in a direction extending between the pair of protruding sides of the shields, and a third axis is defined in a direction in which the pair of protruding sides extend from the bases toward the printed circuit board, and
wherein the center of each current sensor is spaced apart from a center line of the corresponding bus bar by a fourth distance along the second axis, and
wherein the center line of the corresponding bus bar is spaced apart from a center between the pair of protruding sides of the corresponding shield by the fourth distance along the second axis.

2. The current sensor assembly of claim 1, further comprising a housing cover located at an upper end of the housing to cover the inside of the housing, the housing cover having a main body and at least one support portion extending downward to contact the printed circuit board.

3. The current sensor assembly of claim 1, wherein the printed circuit board includes a plurality of grooves separating the current sensors, and
wherein portions of the shields extend into the grooves.

4. The current sensor assembly of claim 1, wherein volumes of each of the shields are estimated according to widths and thicknesses of the plurality of shields and lengths of the protruding surfaces, and
wherein the volumes of each of the shields are selected to ensure linearity in a numerical range in which the plurality of current sensors measure the current applied to the plurality of bus bars for a range of currents passing though the plurality of bus bars.

5. The current sensor assembly of claim 4, wherein the plurality of shields and the plurality of bus bars are spaced apart from each other by a first distance along the third axis to ensure the linearity in the numerical range in which the plurality of current sensors measure the current applied to the plurality of bus bars for the range of the currents passing through the plurality of bus bars.

6. The current sensor assembly of claim 5, wherein the centers of the plurality of current sensors and the plurality of bus bars are spaced apart from each other by a second distance along the third axis to ensure the linearity in the numerical range in which the plurality of current sensors measure the current applied to the plurality of bus bars for the range of the currents passing through the plurality of bus bars.

7. The current sensor assembly of claim 1, wherein the center of each current sensor is spaced apart from the base of the corresponding shield by a third distance along the third axis.

8. The current sensor assembly of claim 1, wherein the centers of the plurality of current sensors are spaced apart from upper surfaces of the plurality of bus bars by a constant distance along the third axis.

9. The current sensor assembly of claim 1, wherein a width of a portion of each bus bar between the pair of protruding sides of the corresponding shield is less than a width of a portion of each bus bar outside of the corresponding shield.

10. The current sensor assembly of claim 1, further comprising a mold configured to fix the locations of the plurality of shields and the plurality of bus bars in the housing.

11. The current sensor assembly of claim 10, wherein the pair of protruding sides of each of the shields extends beyond the mold.

12. An inverter assembly for an integrated power device, the inverter assembly comprising:
a bulk capacitor;
a control board; and
a current sensor assembly including:
a housing;
a plurality of shields located in the housing, each shield having an inner space open toward a top of the housing;
a plurality of spaced apart bus bars configured to have three phase current applied thereto located in the housing, each bus bar extending through a corresponding shield of the plurality of shields;
a printed circuit board located in the housing; and
a plurality of current sensors located on the printed circuit board, each current sensor being configured to measure a current applied to a corresponding bus bar of the plurality of bus bars, and each current sensor being spaced from the corresponding bus bar in the inner space of the corresponding shield, and
wherein each shield includes:
a base located at an inner side of the housing; and
a pair of protruding sides extending from opposite ends of the base,
wherein each bus bar is located near the base of the corresponding shield and extends between the pair of protruding sides of the corresponding shield,
wherein a center of each current sensor is centrally located between the pair of protruding sides of the corresponding shield, wherein, for each shield, a first axis is defined in a direction in which the corresponding bus bar extends over the base of the shield, a second axis is defined in a direction extending between the pair of protruding sides of the shields, and a third axis is defined in a direction in which the pair of protruding sides extend from the bases toward the printed circuit board, and wherein the center of each current sensor is spaced apart from a center line of the corresponding bus bar by a fourth distance along the second axis, and wherein the center line of the corresponding bus bar is spaced apart from a center between the pair of protruding sides of the corresponding shield by the fourth distance along the second axis.

13. The inverter assembly of claim 12, wherein the center of each current sensor is spaced apart from the base of the corresponding shield by a third distance along the third axis.

14. The inverter assembly of claim 12, wherein the centers of the plurality of current sensors are spaced apart from upper surfaces of the plurality of bus bars by a constant distance along the third axis.

* * * * *